United States Patent [19]

Sakurai et al.

[11] Patent Number: 5,631,494
[45] Date of Patent: May 20, 1997

[54] POWER SEMICONDUCTOR DEVICE WITH LOW ON-STATE VOLTAGE

[75] Inventors: Naoki Sakurai; Yoshitaka Sugawara, both of Hitachi, Japan

[73] Assignee: Hitachi, Ltd., Tokyo, Japan

[21] Appl. No.: 308,292

[22] Filed: Sep. 19, 1994

[30] Foreign Application Priority Data

Sep. 17, 1993 [JP] Japan .................. 5-231252

[51] Int. Cl.$^6$ .................. H01L 29/74; H01L 29/00; H01L 27/082
[52] U.S. Cl. .................. 257/572; 257/139; 257/566; 257/577
[58] Field of Search .................. 327/310, 311, 327/312, 313, 314, 384, 432, 403, 404, 405, 482, 572, 438, 566; 257/139, 577

[56] References Cited

U.S. PATENT DOCUMENTS

| | | | |
|---|---|---|---|
| 5,091,664 | 2/1992 | Furuhata | 327/574 |
| 5,272,392 | 12/1993 | Wong et al. | 327/109 |
| 5,366,916 | 11/1994 | Summe et al. | 257/369 |
| 5,371,420 | 12/1994 | Nakao | 327/384 |
| 5,422,593 | 6/1995 | Fujihira | 327/561 |
| 5,432,471 | 7/1995 | Majumdar et al. | 327/310 |

Primary Examiner—Sara W. Crane
Assistant Examiner—Fetsum Abraham
Attorney, Agent, or Firm—Antonelli, Terry, Stout & Kraus, LLP

[57] ABSTRACT

A circuit connecting a sub-IGBT element $S_2$ having a smaller current capacity and a smaller saturated current than the main IGBT element $S_1$ and a resistance $R_1$ in series is connected to the main IGBT element $S_1$ in parallel, a MOSFET element $S_3$ being connected between the gate electrode of the sub-IGBT element $S_2$ and the emitter electrode of the main IGBT element $S_1$, a delay element being connected between the gate electrode of the sub-IGBT element $S_2$ and the gate electrode of the main IGBT element $S_1$. In normal operation, the ON-state voltage is small and low loss can be realized. In the event of a short-circuit accident, the sub-IGBT element $S_2$ detects the short-circuit before the main IGBT element $S_1$ turns on to prevent an over-current from flowing in the main IGBT element $S_1$, which substantially improves the short-circuit resistivity of the semiconductor device.

29 Claims, 8 Drawing Sheets

POWER SEMICONDUCTOR DEVICE WITH LOW ON-STATE VOLTAGE

BACKGROUND OF THE INVENTION

1. Field of the Invention

The present invention relates to a power semiconductor device, and more particularly to a semiconductor device having a low ON-state voltage and a large load short-circuit resistivity.

2. Description of the Prior Art

Insulated gate bipolar transistor (hereinafter, referred to as "IGBT") is widely used in the various field such as power source, inverter and the like, since the insulated gate bipolar transistor is a voltage driven type element and requires a simple driving circuit comparing to a current driven type bipolar transistor. Further, the insulated gate bipolar transistor has been widely and rapidly used in a field of comparatively high voltage, since the loss in normal operation is smaller than that of a MOSFET which is also a voltage driven type element.

In order to protect a device having an IGBT from breakdown, it is required for the IGBT to be broken down for a certain period of short-circuit state even when the device is operated with the load short-circuited. As a means against this problem, an over-current protecting circuit is provided in the IGBT (Japanese Patent Application Laid-Open No. 2-66975 (1990). The circuit comprises a first main terminal $T_1$, a second main terminal $T_2$, a control terminal $T_3$, a main IGBT element $S_1$ having a collector, an emitter and a gate connected to the first main terminal $T_1$, the second main terminal $T_2$ and the control terminal $T_3$ respectively, a sub-IGBT element $S_2$ having a smaller capacity than the capacity of the main IGBT element $S_1$ and having a collector connected to the first main terminal $T_1$, an emitter connected to the second main terminal $T_2$ through a resistance R and a gate connected to the control terminal $T_3$ respectively, a mosfet element $S_3$ having a gate connected to the junction point of the sub-IGBT element $S_2$ and the resistance R, a source and a drain connected to the second main terminal $T_2$ and the control terminal $T_3$ respectively. The operation of the circuit is as follows. When a load connected between the first main terminal and the second main terminal is short-circuited, an over-current approximately proportional to the current capacity flows between the first and the second terminals, that is, between the main IGBT element $S_1$ and the sub-IGBT element $S_2$. As the current flowing through the sub-IGBT element $S_2$ increases due to the over-current, the voltage drop consequently increases due to the resistance R. When the voltage drop due to the resistance R exceeds the threshold of the MOSFET element $S_3$, the MOSFET element $S_3$ is brought into ON-state. When the MOSFET element $S_3$ is brought into ON-state, the circuit between the control terminal $T_3$ and the second main terminal $T_2$ is short-circuited through the ON-state resistance of the MOSFET element $S_3$. Consequently the gate voltages in the main IGBT element $S_1$ and in the sub-IGBT element $S_2$ decrease, the over-currents flowing through the main IGBT element $S_1$ and through the sub-IGBT element $S_2$ are suppressed or cut off to protect the device against break-down.

In a conventional technology, the main IGBT element $S_1$ and the sub-IGBT element $S_2$ are composed of most of or a part of small IGBT units, so-called cells, (for example, several tens of the cells) which are formed in a single semiconductor substrate by several thousands to several ten thousands in number at a time. This is because the ratio of currents flowing through the main IGBT element $S_1$ and the sub-IGBT element $S_2$ is accurately designed and the ratio of the currents does not change depending on the substrate temperature. Therefore, the surface structure and the cross-sectional structure of the main IGBT element $S_1$ through which main current flows are the same as those of the sub-IGBT element $S_2$ for detecting current. On account of this, there is a disadvantage in that the ON-state voltage increases and the loss consequently increases when the short-circuit resistivity is kept high, and the load short-circuit resistivity (the time period from entering of IGBT element into ON-state to break-down of the IGBT element with the load short-circuited) decreases when the ON-voltage is lowered in order to decrease the loss. This phenomena will be described below in detail.

The output characteristic of an IGBT, shown with taking the voltage between collector-emitter in abscissa and the output current in ordinate, can be divided into three regions, (I) a region where the current hardly flows until the p-n junction in the collector side is forward-biased against the voltage between collector-emitter, (II) a region where the current linearly increases as the voltage increase, (III) a region where the current hardly increases and is saturated regardless of increasing of the voltage. The IGBT is generally used in the region (II) where the current linearly increases as the voltage increase. On the other hand, the voltage drop caused in an IGBT at rated current is called as ON-state voltage. And the lower the ON-state voltage is, the lower the loss of the IGBT is. And the larger the gradient in the region (II) where the current linearly increases is, the larger the output current is and the smaller the ON-state voltage is. The output current $I_c$ consists of electron current and hole current. Since the hole current is the collector current in the p-n-p transistor with the electron current as the base current, the hole current, putting the electron current as $I_e$, is expressed by multiplying the amplification factor $\beta$ of the p-n-p transistor to the electron current $I_e$, that is, $I_e \times \beta$. Then the output current $I_c$ can be expressed as the following equation.

$$I_c = (1+\beta) \times I_e \qquad (1)$$

The output current $I_c$ is proportional to the electron current $I_e$. Further, the electron current $I_e$ is proportional to the conductance gm which is given by the following equation.

$$gm = W/L \times \mu_{CH} \epsilon_{SiO2}/t_{ox} \times (V_G - V_T), \qquad (2)$$

where W: gate width, L: gate length, $t_{ox}$: thickness of oxide film, $V_g$: gate voltage, $V_T$: threshold voltage, $\mu_{CH}$: mobility of channel layer, $\epsilon_{SiO2}$: dielectric constant of the oxide film.

It can be understood from this equation that in a case of a constant element area and a constant gate voltage, the value of gm becomes larger, that is, the electron current flows more and consequently the ON-state voltage becomes lower as the gate width is longer, the gate length being shorter, the oxide film being thinner, the threshold voltage being lower. The saturated current also consists of a constant electron current and a constant hole current flowing when the channel is pinched off. Since the hole current is the collector current of the p-n-p transistor with the electron current as the base current, the saturated current is also proportional to the electron current similar to the output current.

Figure 15:
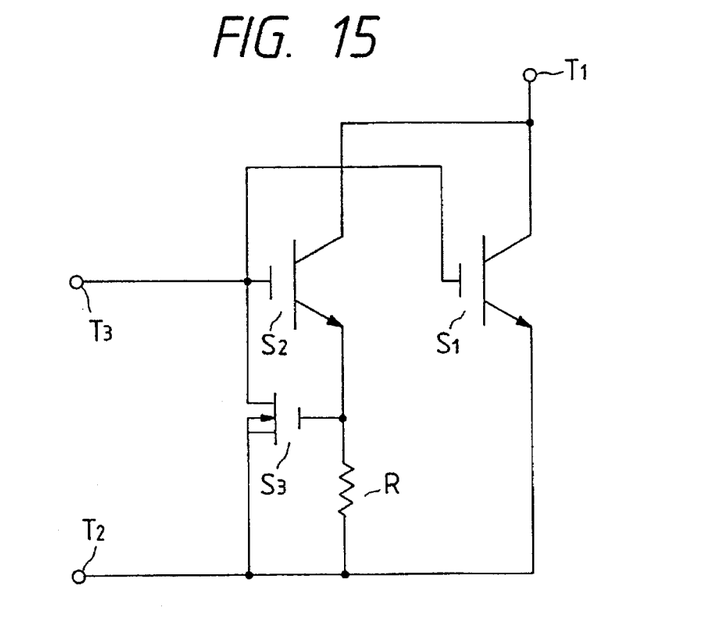
FIG. 15 is a schematic circuit diagram showing an IGBT device having a conventional over-current protection function.

Discussion will be made on a case where the cells composing the main IGBT element $S_1$ and the sub-IGBT element $S_2$ shown in FIG. 15 are the same surface structure and the same cross-sectional structure. In order to decrease the loss in the main IGBT element $S_1$ conducting the main current, a cell is designed to realize a low ON-state voltage in such a way as to increase the value of gm. By doing so, it is natural that the saturated current becomes large. The saturated current means the maximum current flowing in the IGBT element. When the saturated current is large, the joule heat generated proportional to the product of the voltage and the current becomes large. The temperature rise due to this heat makes the ON-state resistance large, finally the parasitic thyristor is latched up and the main IGBT element $S_1$ is broken by overheat. That is, the load short-circuit resistivity is lowered. As described above, the low ON-state voltage and the high load short-circuit resistivity are inconsistent with each other. It is impossible to realize the both at a time.

On account of this reason mentioned above, in a practical design of assigning priority to the over-current protection, the saturated current is suppressed by means of making the value of gm so small that the main IGBT element $S_1$ conducting the main current and the sub-IGBT element $S_2$ conducting the current for detecting over-current have a load short-circuit resistivity larger than the time period from the time the gate receives an ON-state signal to the time the MOSFET element $S_3$ turns into an ON-state. Therefore, the ON-state voltage has a performance penalty.

SUMMARY OF THE INVENTION

An object of the present invention is to provide a semiconductor device which has a small ON-state voltage and a large load short-circuit resistivity.

Another object of the present invention will be clarified by the following embodiment.

The present invention is made from a new point of view that the short-circuit protection at starting of a semiconductor device is important since a load short-circuit has been often exist before operation of the device due to the mistake of wiring. The feature of the present invention is that a semiconductor device having a first voltage control semiconductor element for controlling main current and a second voltage control semiconductor element conducting current smaller than the main current, short-circuit being detected from the current flowing through the second voltage control semiconductor element, the control voltages in the first and the second voltage control semiconductor elements being lowered, wherein the first voltage control semiconductor element is turned on with a time lag behind the second voltage control semiconductor element is turned on, the saturated current per unit area of the first voltage control semiconductor element is larger than that of the second voltage control semiconductor element. More specifically, it is ideal that short-circuit is detected from the current flowing through the second voltage control semiconductor element and the control voltages in the first and the second voltage control semiconductor elements are lowered, and then the first voltage control semiconductor element is turned on.

For turning on the first voltage control semiconductor element with a time lag behind the second voltage control semiconductor element being turned on, a delay element having a resistance component is connected to the control electrode of the first voltage control semiconductor element.

For making the saturated current per unit area of the first voltage control semiconductor element larger than the second voltage control semiconductor element, there are a lot of ways, that is, making the channel conductance of the first voltage control semiconductor element larger than that of the second voltage control semiconductor element, more specifically making the gate width per unit area of the first voltage control semiconductor element larger than that of the second voltage control semiconductor element, making the gate length of the second voltage control semiconductor element larger than that of the first voltage control semiconductor element, making the thickness of the gate oxide film of the second voltage control semiconductor element larger than that of the first voltage control semiconductor element, making the mobility of the channel layer of the first voltage control semiconductor element larger than that of the second voltage control semiconductor element and so on.

A MOS gate turn-off thyristor may be used as the first voltage control semiconductor element instead of the insulated gate bipolar transistor.

By employing the construction described above, the second voltage control semiconductor element having a small saturated current per unit area turns on first even when an ON-signal is applied with the load short-circuited, the short-circuit being detected from the current flowing through the second voltage control semiconductor element, the voltage level of the ON-signal being lowered in a case of short-circuit, then the first voltage control semiconductor element having a large saturated current per unit area being turned on. Therefore, there are the following effects.

(1) There is no fear of the first voltage control semiconductor element thermally broken even when an ON-signal is applied with the load short-circuited.

(2) The short-circuit can be certainly detected without the fear of the first voltage control semiconductor element thermally broken since the second voltage control semiconductor element turned on first by the ON-signal has a small saturated current per unit area.

(3) The first voltage control semiconductor element can be lowered its ON-state voltage and its loss since the saturated current per unit area of the first voltage control semiconductor element for controlling main current is made large.

(4) From the above results, it can be attained to lowered the loss and to improve the short-circuit resistivity of the first voltage control semiconductor element.

DETAILED DESCRIPTION OF THE PREFERRED EMBODIMENTS

The semiconductor device according to the present invention will be described in detail below, referring to the drawings shown as embodiments.

Figure 1:
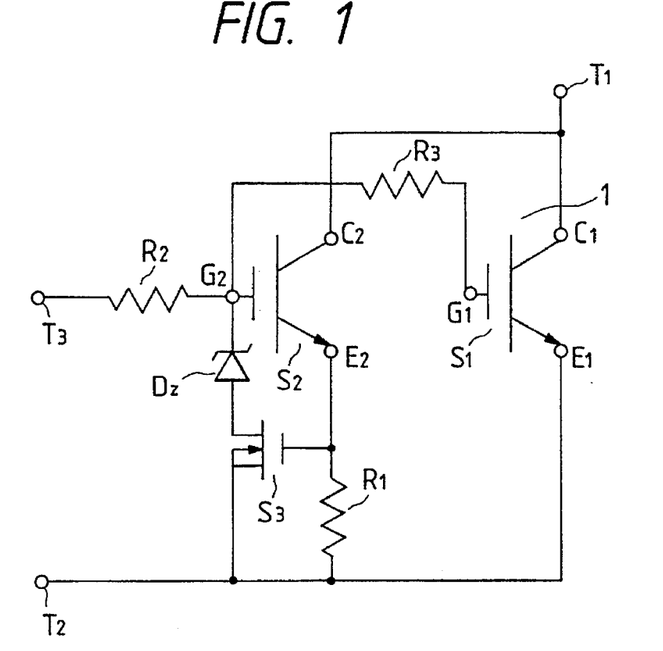
FIG. 1 is a schematic circuit diagram showing an embodiment of a semiconductor device in accordance with the present invention.

FIG. 1 is a circuit diagram showing an embodiment of a semiconductor device in accordance with the present invention. In the figure, the symbol $T_1$ is a first main terminal, the symbol $T_2$ being a second main terminal having a voltage different from the first main terminal $T_1$, the symbol $T_3$ being a control terminal, the symbol $S_1$ being a main IGBT element having a collector electrode $C_1$, an emitter electrode $E_1$ and a gate electrode $G_1$, the collector electrode $C_1$ being connected to the first main terminal $T_1$, the emitter electrode $E_1$ being connected to the second main terminal $T_2$, the symbol $S_2$ being a sub-IGBT element having a smaller saturated current per unit area than the main IGBT element $S_1$, having a collector $C_2$, an emitter electrode $E_2$ and a gate electrode $G_2$, the collector electrode $C_2$ being connected to the first main terminal $T_1$, the emitter electrode $E_2$ being connected to the second main terminal $T_2$ through a resistance $R_1$, the gate electrode $G_2$ being connected to the control terminal $T_3$ through a resistance $R_2$, the symbol $S_3$ being a MOSFET element, its gate being connected to the junction point of the sub-IGBT element $S_2$ and the resistance $R_1$, its source being connected to the second main terminal $T_2$, its drain being connected to the gate electrode $G_2$ of the sub-IGBT element $S_2$ through a Zener diode $D_Z$, the symbol $R_3$ being a resistance serving as a delay element, being connected between the gate electrode $G_1$ of the main IGBT element $S_1$ and the gate electrode $G_2$ of the sub-IGBT element $S_2$. The main IGBT element $S_1$ controls to conduct the main current flowing between the first main terminal $T_1$ and the second main terminal $T_2$, and the function of the sub-IGBT element $S_2$ is to branch and conduct a part of the main current flowing through the main IGBT element $S_1$. The function of the resistance $R_1$ and the MOSFET element $S_3$ is to detect whether the main current flowing through the main IGBT element $S_1$ is in an over-current state from the current flowing through the sub-IGBT element $S_1$. That is, the MOSFET element $S_3$ does not turn into an ON-state operation when the main current is in a normal condition since the MOSFET element is so designed that the voltage given by the product of the current flowing through the sub-IGBT element $S_2$ and the resistance $R_1$ is smaller than the threshold voltage of the MOSFET element $S_3$, and when the main current enters in an over-current state, the voltage given by the product of the current flowing through the sub-IGBT element $S_2$ and the resistance $R_1$ exceeds the threshold voltage of the MOSFET element $S_3$ and the MOSFET element $S_3$ turns into an ON-state to be detected whether the main current is in an ON-state condition. The function of the resistance $R_3$ is to delay the turning-on of the main IGBT element $S_1$ behind the turning-on of the sub-IGBT element $S_2$ by the time lag determined by the product of the resistance $R_3$ and the input capacity in the gate of the main IGBT element $S_1$ when an ON-signal (gate signal) is applied to the control terminal $T_3$.

The operation of the semiconductor device having the circuit construction described above will be described below.

As described above, the MOSFET element $S_3$ does not turn into an ON-state operation when the main current is in a normal condition since the voltage given by the product of the current flowing through the sub-IGBT element $S_2$ and the resistance $R_1$ is smaller than the threshold voltage of the MOSFET element $S_3$, and the main current is controlled with the ON-OFF operation of the main IGBT element $S_1$ and the sub-IGBT element $S_2$ by the ON-signal from the control terminal $T_3$.

Next, for example, when a short-circuit accident occurs in the side of the load connected between the first main terminal $T_1$ and the second main terminal $T_2$, the current initially flowing at turning of the sub-IGBT element $S_2$ to ON-state by the ON-signal from the control terminal $T_2$ is the short-circuit current (saturated current determined by the gate voltage), and the voltage given by the product of the current flowing through the sub-IGBT element $S_2$ and the resistance $R_1$ exceeds the threshold voltage of the MOSFET element $S_3$ and the MOSFET element $S_3$ turns into an ON-state to be detected whether the main current is in an ON-state condition. Therewith, the ON-signal voltage from the control terminal $T_3$ is applied to the both terminals of the Zener diode $D_Z$. By means of setting the Zener voltage at a desired voltage lower than the ON-signal voltage, the ON-signal voltage applied to the gate electrode $G_1$ of the main IGBT element $S_1$ is suppressed lower than the ON-signal voltage from the control terminal $T_3$ to suppress the saturated current of the main IGBT element $S_1$ and to improve the short-circuit resistivity.

Figure 2:
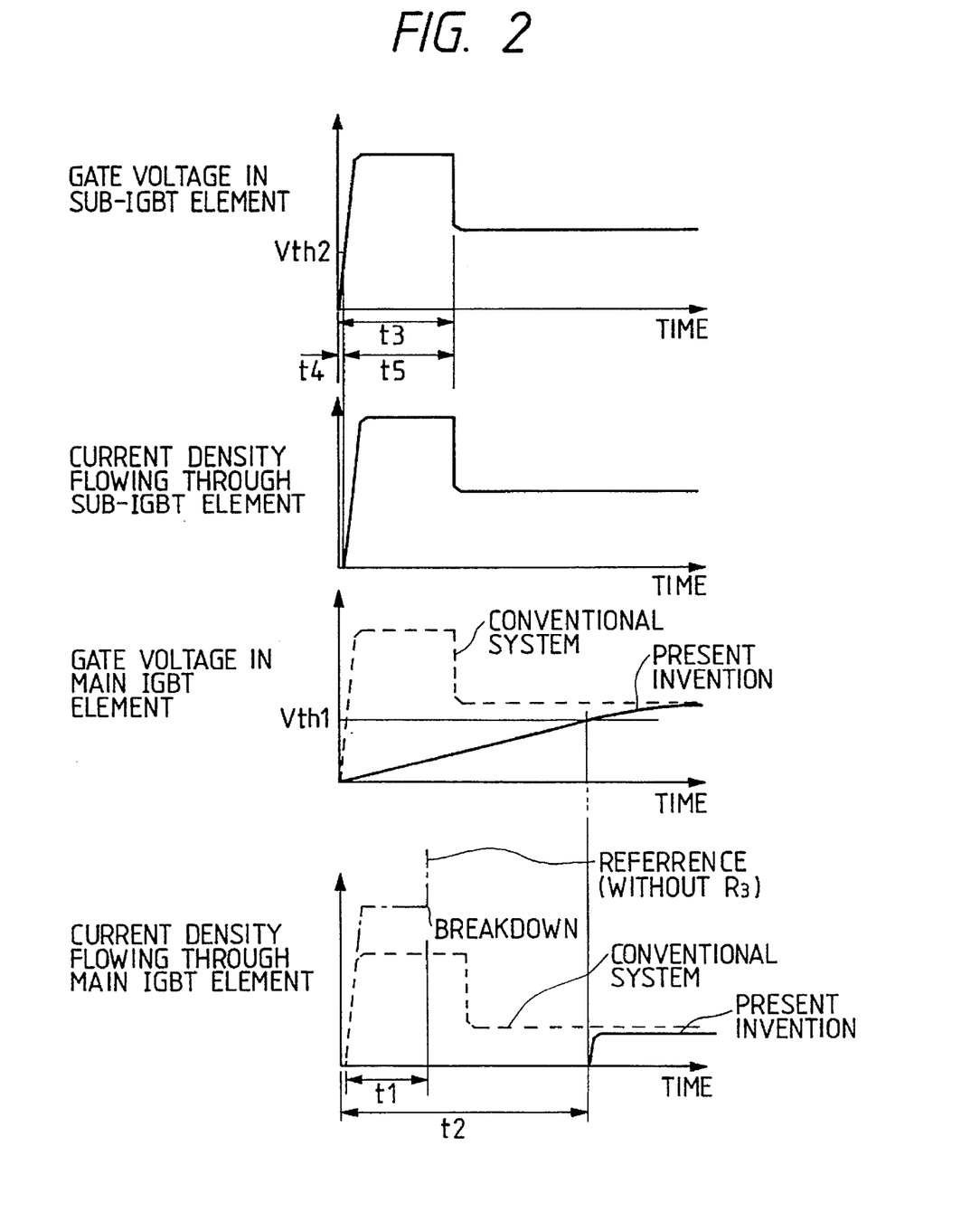
FIG. 2 is a wave form chart showing the changes over time in the gate voltage and current for explaining the operation of the semiconductor device in accordance with the present invention.

FIG. 2 shows the changes over time in the gate voltage and current densities of the main IGBT element $S_1$ and the sub-IGBT element $S_2$. In the figure, the solid line indicates a case of the present invention, the dotted line indicates a case of the conventional construction shown in FIG. 15, and the dash-and-dot line indicates a case of the present invention but eliminating the resistance $R_3$ for a reference purpose. When a gate voltage is applied to the control terminal $T_3$ and the gate voltage of the sub-IGBT element $S_2$ exceeds the threshold voltage $V_{th2}$, current starts to flow through the sub-IGBT element $S_2$. When the gate voltage of the sub-IGBT element $S_2$ gradually increases and gets to a voltage equal to the gate voltage applied to the control terminal $T_3$, the current flowing through the sub-IGBT element $S_2$ becomes the saturated current determined by the gate voltage.

In the conventional structure, when the threshold voltage $V_{th1}$ of the main IGBT element $S_1$ is equal to the threshold voltage $V_{th2}$ of the sub-IGBT element $S_2$, both of the sub-IGBT element $S_2$ and the main IGBT element $S_1$ turn on at a time, and the current through the main IGBT element $S_1$ gets to its saturated current at the same time as the current through the sub-IGBT element $S_2$ gets. Then the saturated currents in both of the main IGBT element $S_1$ and the sub-IGBT element $S_2$ decrease since an over-current protecting means starts to operate to decrease the gate voltages. In this moment, since the surface structure and the cross-sectional structure of the main IGBT element $S_1$ are the same as those of the sub-IGBT element $S_2$, the saturated currents for both of the elements are the same. Further, the gate voltage is applied to both of the gate electrodes of the main IGBT element $S_1$ and the sub-IGBT element $S_2$ at the same time because of lack of the resistance $R_3$. Therewith, the short-circuit resistivity of the main IGBT element $S_1$ is the same as that of the sub-IGBT element $S_2$, and consequently the main IGBT element $S_1$ is thermally broken unless the short-circuit resistivity is longer than the time $t_3$ for decreasing the voltage. Therefore, there is a limitation in attempt to increase the output current and to decrease the ON-state voltage by means of increasing the value gm because of decrease in the short-circuit resistivity.

In the present invention, since the saturated current per unit area (saturated current density) of the main IGBT element $S_1$ is larger than that of the sub-IGBT element $S_2$, the short-circuit resistivity $t_1$ of the main IGBT element $S_1$ for this gate voltage is shorter than the short-circuit resistivity of the sub-IGBT element $S_2$. If the device in accordance with the present invention does not have the resistance $R_3$, the gate voltage applied to the control terminal $T_3$ is applied to both of the main IGBT element $S_1$ and the sub-IGBT element $S_2$ at the same time, the main IGBT element $S_1$ turning into ON-state. Therefore, even when the gate voltage applied to the main IGBT element $S_1$ is decreased by operation of the MOSFET element $S_3$, the main IGBT element $S_1$ has been thermally broken before that time due to an excessive large over-current as shown by dash-and dot line. In the present invention, since the device has the resistance $R_3$, the main IGBT element $S_1$ is turned on with a time delay behind the sub-IGBT element $S_2$ being turned on by the time corresponding to a time constant determined by the product of the resistance $R_3$ and its input capacity. The magnitude of the resistance $R_3$ is chosen such that the time $t_3$ from the gate voltage being applied to the control terminal $T_3$ to the gate electric potentials of the both elements being lowered is smaller than the sum of the delay time $t_2$ for turning-on the main IGBT element $S_1$ and the short-circuit resistivity $t_1$ of the main IGBT element $S_1$. In this moment, it is preferable that $t_2$ is larger than $t_3$. By doing so, since the gate voltage applied to the main IGBT element $S_1$ is lowered before the main IGBT element $S_1$ turns on, the main IGBT element is not broken even when $t_1$ is nearly zero. Therefore, the ON-state voltage of the main IGBT element $S_1$ can be made very small.

The value of the resistance $R_3$ will be calculated below, taking an IGBT of 600 V, 100 A class operable with gate voltage of 15 V as an example. It is better that the current flowing through the resistance $R_1$ and the sub-IGBT element $S_2$ is chosen such that the MOSFET element $S_3$ operates only when the saturated current flows. By doing so, an operating error during over-current can be avoided. The current for detecting the over-current is set in approximately 100 mA. This current is the current flowing at saturated state, and the current flowing during a normal state is smaller than this current. The saturated current for the IGBT of this class is generally approximately 2.5 to 5 times as large as the rated current. Therefore, the areal ratio of the main IGBT element $S_1$ and the sub-IGBT element $S_2$ becomes 100 A/100 mA×2.5–5=2500–5000. The input capacity of the main IGBT element $S_1$ is approximately 4000 to 8000 pF. Using these data, the input capacity of the sub-IGBT element $S_2$ can be calculated as 0.8–3.4 pF. The voltage applied to the gate electrode $G_2$ of the sub-IGBT element $S_2$ when a short-circuit occurred is determined by the Zener voltage of the Zener diode $D_Z$ and the ratio of the resistance $R_2$ and the ON-state resistance of the MOSFET element $S_3$.

Since the ON-state resistance of the MOSFET element $S_3$ largely varies with temperature change, it is preferable that the ON-state resistance of the MOSFET element $S_3$ is made sufficiently smaller than the resistance $R_2$ so that the voltage applied to the sub-IGBT element $S_2$ is not or not much affected by the temperature change. However, in a case where the MOSFET element $S_3$ is formed on the same chip as the IGBT element is formed, the area of the MOSFET element $S_3$ becomes large when the ON-state resistance of the MOSFET element $S_3$ is made excessively small. On account of this, the ON-state voltage is not sufficiently lowered since the area of the main IGBT element $S_1$ becomes small. Therefore, it is preferable that the ratio of the ON-state resistance of the MOSFET element $S_3$ to the resistance $R_2$ is approximately 1:10–1:5, and the ON-state resistance of the MOSFET element $S_3$ becomes 0.1 ohm–0.2 ohm when the resistance $R_2$ is assumed to be 1 ohm. Now, the ON-state resistance of the MOSFET element $S_3$ is assumed to be 0.2 ohm. Since the voltage of 15 V is normally applied to the control terminal $T_3$, the voltage resistance of the MOSFET element $S_3$ is required to be approximately 20 V. The input capacitance of the MOSFET element $S_3$ having withstand voltage of 20 V and ON-state resistance of 0.2 ohm is approximately 400 pF. The time $t_3$ from applying voltage to the control terminal $T_3$ to the gate voltage of the sub-IGBT element $S_2$ being lowered is given by the sum of the time $t_4$ required for turning-on of the sub-IGBT element $S_2$ and the time $t_5$ required for turning-on of the MOSFET element $S_3$.

$t_4 = R_2 \times$(input capacitance of the sub-IGBT element $S_2$)=1 ohm×3.4 pF=3.4×10$^{-12}$ seconds.

It is assumed that the resistance $R_1$ is chosen such that the voltage of approximately 10 V is applied to the gate electrode of the MOSFET element $S_3$. Then, $t_5$=(input capacitance of the MOSFET element $S_3$)×10 V/100 mA=400 pF×10 V/100 mA=4×10$^{-8}$ seconds.

Therefore, $t_3 = t_4 + t_5 \approx 4 \times 10^{-8}$ seconds. The time lag of turning-on of the main IGBT element $S_1$ is given approximately by (resistance of the resistance $R_3$)×(input capacitance of the main IGBT element $S_1$). Therefore, the resistance $R_3$ is chosen such that $R_3 > t_3$/(input capacitance of the main IGBT element $S_1$)=4 ohm.

Figure 3:
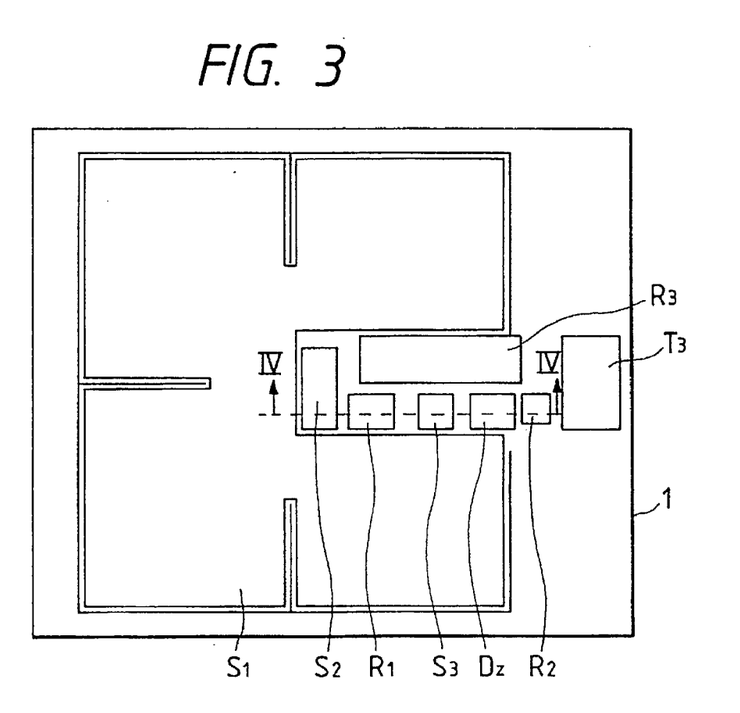
FIG. 3 is a schematic plan view showing a semiconductor device in accordance with the present invention integrated on a single semiconductor substrate.
Figure 4:
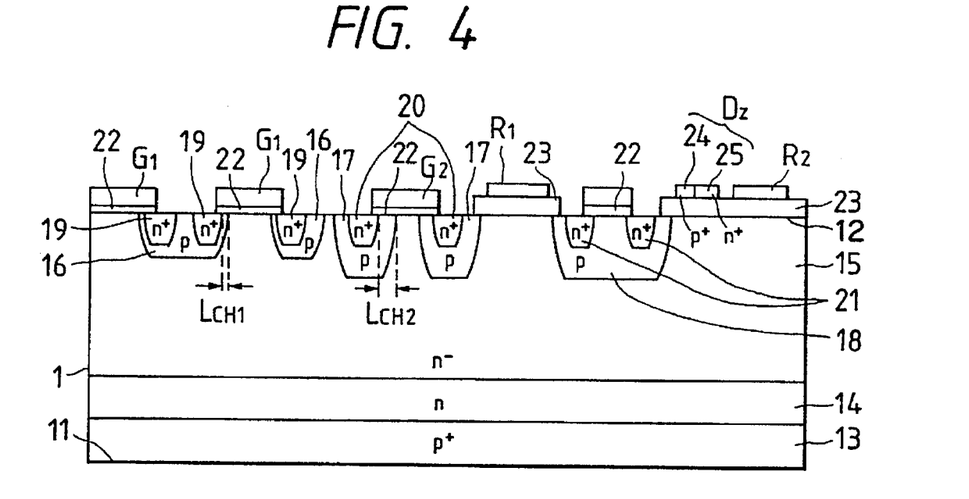
FIG. 4 is a schematic cross-sectional view being taken on the plane of the line IV—IV in FIG. 3.

FIG. 3 and FIG. 4 are a plan view and a cross-sectional view of the semiconductor device in accordance with the present invention shown in FIG. 1 which is integrated in a single semiconductor substrate. Since the circuit operating speed can be accelerated by shortening the wiring lengths owing to integrating in a single semiconductor substrate, there is an advantage in that the time from an over-current flowing through the sub-IGBT element $S_2$ to the gate voltage being lowered is shortened.

The planar structure is, as shown in FIG. 3, that most part of the substrate is occupied by the installation part of main IGBT elements $S_1$ and the substrate has an unoccupied portion near a control terminal $T_3$ where a resistance $R_2$, a Zener diode $D_Z$, a MOSFET element $S_3$, a resistance $R_1$ and a resistance $R_3$ are aligned in this order from the control terminal $T_3$ side, and a sub-IGBT element $S_2$ is aligned innermost. The part of main IGBT elements $S_1$ is surrounded by a gate wire being connected to the resistance $R_3$, The cross-sectional structure is as shown in FIG. 4. That is, the semiconductor substrate 1 has a $p^+$ layer 13 adjacent to one of the main surface 11, an n-layer 14 adjacent to the $p^+$-layer 13, an $n^-$layer 15 adjacent to the other main surface 12, a plurality of p-regions 16 extending from the other main surface 12 to the inside of the $n^-$-layer 15, a plurality of p-regions 17 formed separately from the p-regions 16 and deeper than the p-regions 16, a p-region 18 extending from the other main surface 12 into the $n^-$layer 15 and formed separately from the p-regions 16 and from the p-regions 17 and deeper than the p-regions 16, an $n^+$-region 19 extending from the other main surface 12 to the inside of each of the p-regions 16, an $n^+$-region 20 extending from the other main surface 12 into the inside of each of the p-regions 17, and at least two of $n^+$-regions 21 extending from the other main surface 12 into the inside of p-regions 18. Gate electrodes made of poly-silicon are formed on the other main surface 12 of the semiconductor substrate 1 through gate oxide films 22 from the $n^+$-region 19 to the $n^-$-region 15 across the p-region 16, from the $n^+$-region 20 to the $n^-$-layer 15 across the p-region 17, and from the $n^+$-region 21 to the $n^+$-region 21 across the $n^+$-region 18. resistances $R_1$ and $R_2$ made of poly-silicon are formed on the $n^-$-layer 15 over the other main surface 12 through insulating films 23. Further, a Zener diode $D_Z$ composed of a $p^+$-polysilicon layer 24 and a $p^-$-poly-silicon layer 25 is formed on the insulating film 23. In the figure, electrodes and wiring are not shown. A main IGBT element $S_1$ is formed of the $p^+$-layer 13, the n-layer 14, the $n^-$-layer 15, the p-region 16 and the $n^+$-region 19, and the sub-IGBT element $S_2$ is formed of the $p^+$-layer 13, the n-layer 14, the $n^-$-layer 15, the p-region 17 and the $n^+$-region 20. In this embodiment, the depth of the p-region 16 being the base layer for the main IGBT element $S_1$ is shallower than the depth of the p-region being the base layer for the sub-IGBT element $S_2$. On the other hand, the depths of the $n^+$-layers 19 and 20 being the emitter layers of the both IGBT elements are the same. Therefore, the channel length $L_{CH1}$ of the main IGBT element $S_1$ is shorter than the channel length $L_{CH2}$ of the sub-IGBT element $S_2$. On account of this, the value gm per unit emitter length of the main IGBT element $S_1$ is larger than the value gm per unit emitter length of the sub-IGBT element $S_2$, and consequently the ON-stage voltage for the main IGBT element $S_1$ is lower than the ON-state voltage for the sub-IGBT element $S_2$ when the current densities are the same. On the other hand, the saturated current density of the sub-IGBT element $S_2$ is smaller than that of the main IGBT element $S_1$. The resistance of the p-region 17 under the $n^+$-region 20 of the sub-IGBT element $S_2$ is smaller than the resistance of the p-region 16 under the $n^+$-region 19 of the main IGBT element $S_1$ since the depth of the p-region 17 is deeper than the depth of the p-region 16, which makes the sub-IGBT element $S_2$ hard to latch up. In the embodiment, as described above, in comparing with the same current density, the device is small in loss since the ON-state voltage of the main IGBT element $S_1$ is smaller than the sub-IGBT element $S_2$, and is large in load short-circuit resistivity since the sub-IGBT element $S_2$ has a small saturated current and a structure hard to latch up. That is, in the embodiment, short-circuit is detected with the sub-IGBT element $S_2$ having a large short-circuit resistivity, and the main IGBT element $S_1$ having a small short-circuit resistivity can be protected by making the gate voltage low. On the other hand, in a case of the same output current density, since the main IGBT element $S_1$ has an ON-state voltage lower than the sub-IGBT element $S_2$, the device can be lowered the ON-state voltage comparing with a case where all of the IGBT elements have the same structure as the sub-IGBT element $S_2$ has. In the embodiment, as described above, it is possible to realize both of decreasing ON-state voltage and improving load short-circuit resistivity which have been inconsistent with each other.

Figure 5:
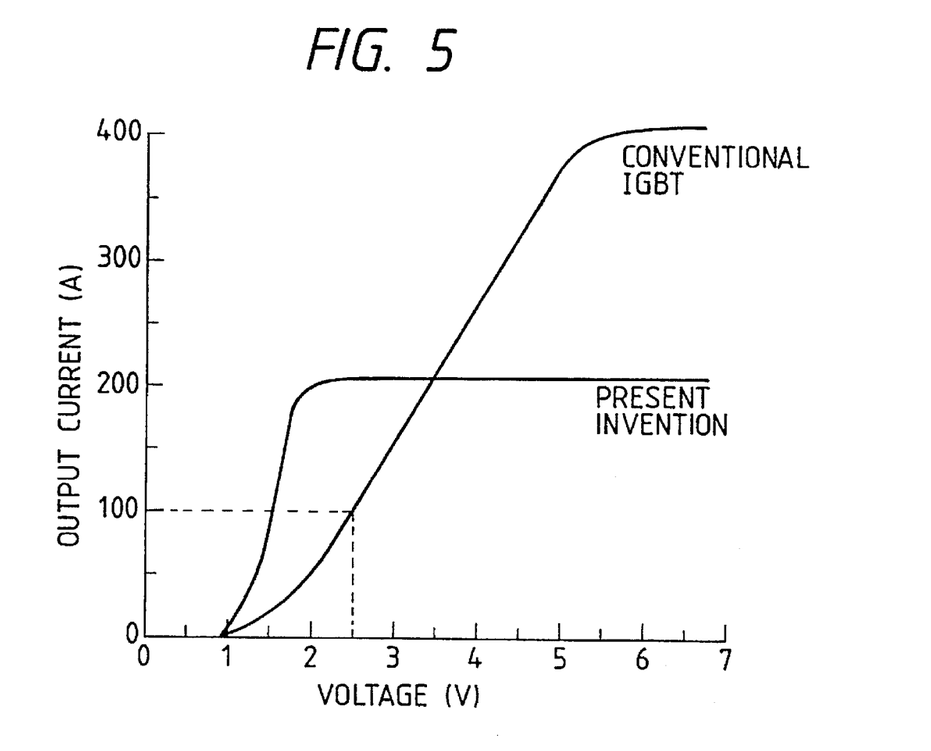
FIG. 5 is a characteristic graph comparing the output characteristic of a semiconductor device according to the present invention with that of a conventional device.

FIG. 5 is a characteristic graph comparing the output characteristic of a semiconductor device according to the present invention with that of a conventional IGBT device having an over-current protection unit. The output characteristic of an IGBT can be divided into three regions, as mentioned above, a region where the current hardly flows until the p-n junction in the collector side is forward-biased against the voltage between collector-emitter, a region where the current abruptly increases with a small number of carriers are started to entered, a region where the current is saturated. In FIG. 5, the comparison is made under the condition in which for the conventional IGBT the main IGBT element and the sub-IGBT element have channel lengths of 5 μm, and for the semiconductor device according to the present invention the main IGBT element has channel length of 1 μm and the sub-IGBT element has channel length of 5 μm. In the semiconductor device according to the present invention, the output current at the voltage where the current abruptly builds up is approximately five times as large as the corresponding current in the conventional IGBT. On account of this, with gate voltage of 15 V and output current of 200 A, the ON-state voltage in the semiconductor device according to the present invention is 1.5 V, which means that the ON-state voltage can be decreased by 1 V comparing to the ON-state voltage of 2.5 V in the conventional IGBT. The saturated current is proportional to the square of the value Y which is obtained by subtracting the threshold value from the gate voltage applied to the gate electrode. Therefore, in a case of the threshold value of 5 V, since the gate voltage applied to the gate electrode is decreased from 15 V to 12 V, the value Y is decreased from 100 to 49 which is approximately one half of the original value, and the saturated current is decreased from 400 A to approximately 400 A.

In order to decrease the ON-state voltage of the main IGBT element at the same current density, it is considered that (1) the thickness of the gate oxide film 22 in the main IGBT element is made thinner than the thickness of the gate oxide film 22 in the sub-IGBT element, and (2) the threshold value of the main IGBT element is made lower than the threshold value of the sub-IGBT element.

Figure 6:
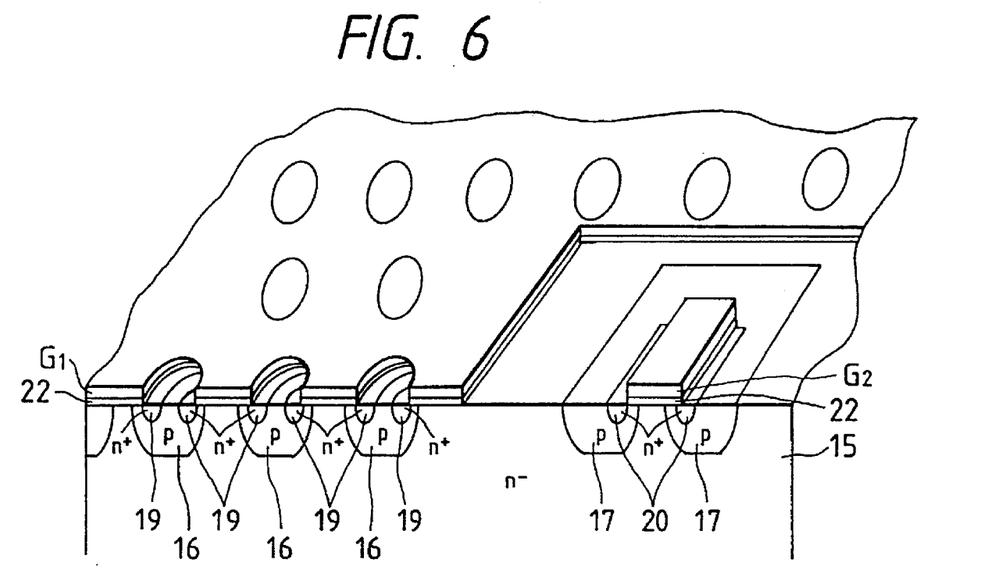
FIG. 6 is a schematic perspective cross-sectional view showing another embodiment of a semiconductor device in accordance with the present invention.

The ON-state voltage of the main IGBT element at the same output current density may be decreased by changing the cell structure. FIG. 6 shows a structure where main IGBT element is constructed by arranging a circular cell, for example, in each vertex of equilateral triangles (hereinafter referred to as "mesh structure"). Since the cells can be arranged most in number per unit area in this structure, the emitter width per unit area can be also made longest. On the other hand, the sub-IGBT element is of stripe structure where the gate is extended in the longitudinal direction and the $n^+$-region 20 is formed along the gate. The mesh structure has an advantage in that the ON-state voltage is low since the emitter width per unit area is larger than that in the stripe structure, but has a disadvantage in that the short-circuit resistivity is small since the saturated current becomes large. Therefore, in the past, the stripe structure has been widely employed with regard for large short-circuit resistivity and without regard for large ON-state voltage. In this embodiment, since the main IGBT element is protected by detecting a short-circuit current with monitoring the current flowing in the sub-IGBT element having a stripe structure and a large short-circuit resistivity, the IGBT element cannot be broken at occurrence of short-circuit and can be decreased in the ON-state voltage even though the main IGBT element is of a mesh structure.

Figure 7:
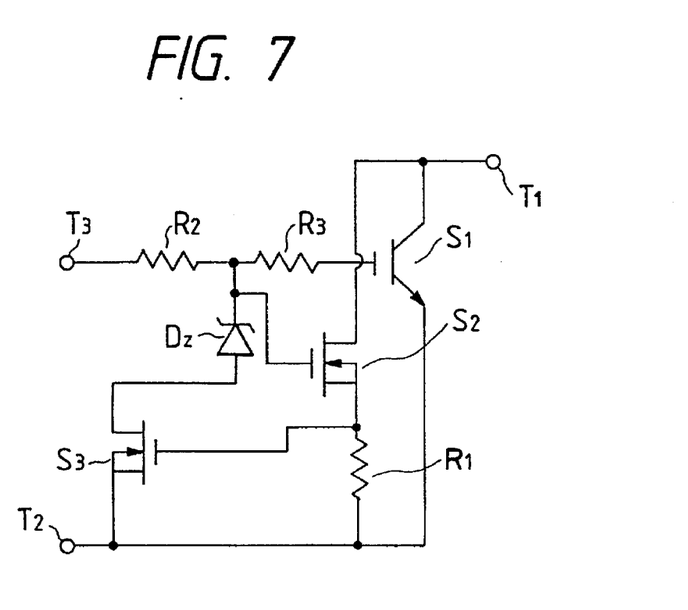
FIG. 7 is a schematic circuit diagram showing another embodiment of a semiconductor device in accordance with the present invention.
Figure 8:
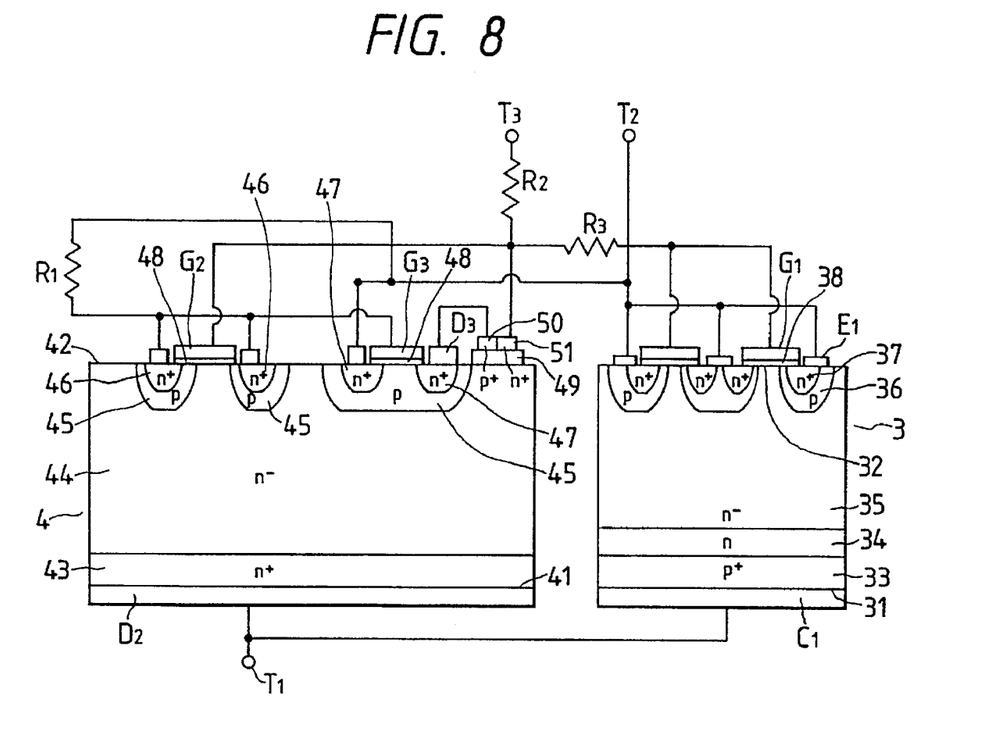
FIG. 8 is a cross-sectional view of a device realizing the semiconductor device in FIG. 7.

FIG. 7 and FIG. 8 show an embodiment in which the kind of first voltage control semiconductor element for controlling the main current is different from the kind of second voltage control semiconductor element conducting the current for detecting short-circuit. FIG. 7 shows the circuit structure. The different point from the structure in FIG. 1 is that a MOSFET element is used as the second voltage control semiconductor element S. The operation in this case is the same as that in FIG. 1, When a short-circuit accident occurs, an over-current to reach a saturated current flows in the MOSFET element $S_2$, which causes the MOSFET element $S_3$ turning on. Then the gate electrode $G_1$ of the main IGBT element serving as the first voltage control semiconductor element $S_1$ is applied with only the voltage determined by the Zener diode $D_Z$. Since the MOSFET element $S_2$, unlike the IGBT, has no region entered by a small number of carriers, that is, has only electron current as the current component, the output current and the saturated current are smaller than those of the IGBT. Therefore, by using a MOSFET element in the second voltage control semiconductor element $S_2$ the short-circuit resistivity can be increased comparing to the case of using an IGBT. Since the MOSFET element $S_2$ is not broken even if the time from detecting short-circuit to decreasing gate voltage is long, it is not required to operate the circuit with a high speed. This means that the circuit shown in FIG. 7 may be formed in separate substrates.

FIG. 8 shows the cross-sectional structure of the semiconductor device shown in FIG. 7. The different point from FIG. 4 is that two semiconductor substrates 3 and 4 are used. The semiconductor substrate 3 has a p±-layer 33 adjacent to one of the main surface 31, an n-layer 34 adjacent to the P±-layer 33, an n⁻-layer 35 adjacent to the n-layer 34 and the other main surface 32, a plurality of p-regions 36 extended from the other main surface 32 into the n⁻-layer 35, an n⁺-region 37 extending from the other main surface 32 into each of the p-regions 36. On one of the main surface 31 a collector $C_1$ is formed. And on the other main surface 32 a gate electrode $G_1$ made of poly-silicon is formed from the n⁺-region 37 to the n-layer 35 across the p-region 36 through a gate oxide film 38, and an emitter electrode $E_1$ contacting to the p-region 36 and to the n⁺-region 37 is formed. By doing this, only the main IGBT element is formed on the semiconductor substance 3. On the other hand, the semiconductor substrate 4 has an n⁺-layer 43 adjacent to one of the main surface 41, an n⁻-layer 44 adjacent to the n⁺-layer 43 and the other main surface 32, a plurality of p-regions 45 extending from the other main surface 42 into the n⁻-layer 44, an n⁺-region 46 extending from the other main surface 42 into each of the selected p-regions 45, at least two n⁺-regions 47 extending from the other main surface 42 into each of the remainder of the p-regions 45. On one of the main surface 41 a drain electrode $D_2$ is formed. And on the other main surface 42, a gate electrode $G_2$ made of poly-silicon is formed from the n⁺-region 46 to the n-layer 44 across the p-region 45 through a gate oxide film 48, a gate electrode $G_3$ made of poly-silicon being formed from the n⁺-region 47 to the n⁺-layer 47 across the p-region 45 through a gate oxide film 48, a source electrode contact to the n⁺-region 46 being formed, a source electrode and a drain electrode $D_3$ contacting to two of the n⁺-region 47 respectively being formed. And further a Zener diode $D_Z$ composed of a p⁺-poly-silicon layer 50 and an n⁺-poly-silicon layer 51 is formed on the n⁻layer 44 on the other main surface 42 through an insulating film 49. By doing so, the MOSFET element $S_2$, the MOSFET element $S_3$ and the Zener diode $D_Z$ are formed on the semiconductor substrate 4 as a single structure. In general, the resistance value of a resistance made of poly-silicon largely varies depending on variations in fabrication process or operating temperature, and consequently the resistance has a disadvantage in that the turn-on/turn-off speed varies. These problems can be solved by means of forming the resistances $R_1$, $R_2$ and $R_3$ separately from the semiconductor substrates 3 and 4.

Figure 9:
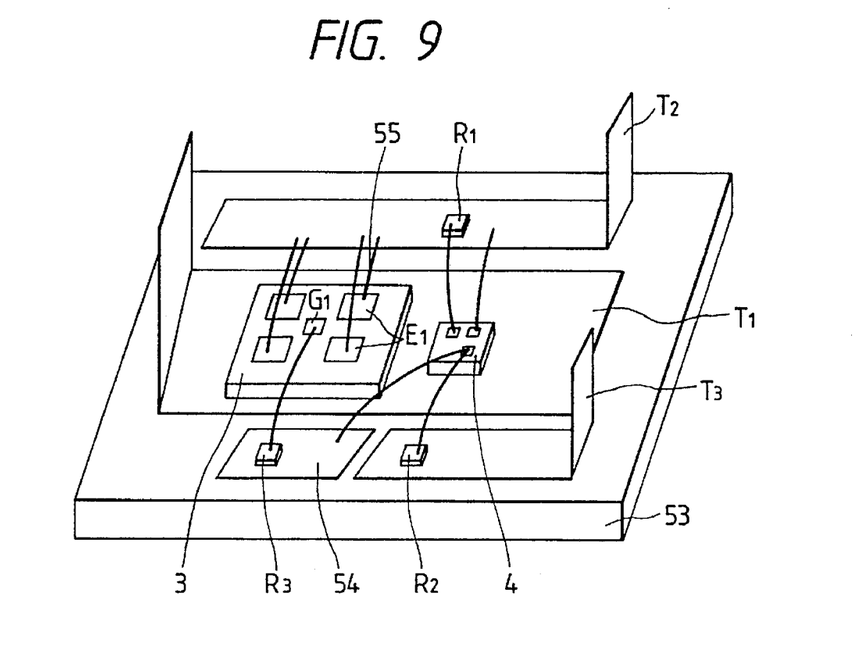
FIG. 9 is a schematic perspective view realizing the semiconductor device in FIG. 7 with modules.

FIG. 9 is a schematic structural view of the semiconductor device which is realized by a module. In this figure, the numeral 53 is an insulating plate, the symbols $T_1$, $T_2$ and $T_3$ being a first main terminal, a second main terminal and a control terminal made of metallic plates having rising parts placed on the insulating plate 53 separately form each other, the numeral 54 being a metallic plate placed on the insulating plate 53 separately from each of the terminals. On the first main terminal $T_1$, semiconductor substrates 3 and 4 shown in FIG. 8 are separately placed facing the collector electrode $C_1$ and the drain electrode $D_2$ to the main terminal $T_1$ side respectively. A resistance $R_2$ is placed on the third main terminal (control terminal) $T_3$, a resistance $R_3$ being placed on the metallic plate 54. By using wire bonding wires 55, the emitter electrode $E_1$ of the semiconductor substrate 3 is connected to the second main terminal $T_2$, the gate electrode $G_1$ of the semiconductor substrate 3 being connected to the resistance $R_3$, the source electrode of the semiconductor substrate 4 being connected to the second main terminal $T_2$ the n⁺-poly-silicon layer 51 of the Zener diode $D_Z$ on the semiconductor substrate 4 being connected to the metallic plate 54 and to the resistance $R_2$. By doing so, the semiconductor device having the circuit structure shown in FIG. 7 can be realized. The module is completed by placing a cup-shaped case on the insulating plate 53 and filling a surface protecting agent such as gel inside the case.

Figure 10:
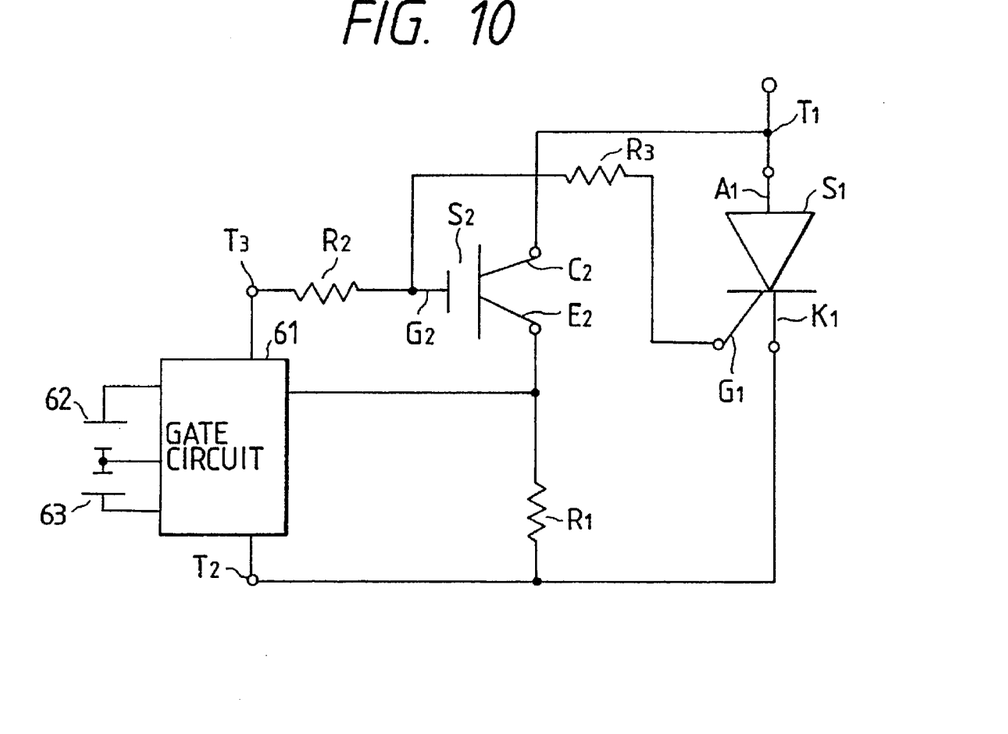
FIG. 10 is a schematic circuit diagram showing a further embodiment of a semiconductor device in accordance with the present invention.

FIG. 10 shows another embodiment in which the kind of first voltage control semiconductor element for controlling the main current is different from the kind of second voltage control semiconductor element conducting the current for detecting short-circuit. In this embodiment, a MOS pate turn-off thyristor (hereinafter referred to as "MOSGTO element") is used as a first voltage control semiconductor element, and an IGBT is used as a second voltage control element. Further different points, other than above-mentioned, from the semiconductor device shown in FIG. 1 are that there is a gate circuit and no MOSFET element $S_3$ and no Zener diode $D_Z$. That is, a gate circuit 61 is connected between a second main terminal $T_2$ and a control terminal $T_3$, and a power source 62 generating positive voltage, a power source 63 generating negative voltage and a junction point of e resistance $R_1$ and an emitter electrode $E_2$ of the sub-IGBT element $S_2$ are connected to the gate circuit 61.

The operation of such an embodiment will be described below. When the gate circuit 61 generates positive voltage under occurrence of a short-circuit accident, over-current flows through the sub-IGBT element $S_2$ and the voltage drop in the resistance $R_1$ increases as described above. On the other hand, the gate circuit 61 monitors the voltage across the resistance $R_1$, and when the voltage exceeds a certain value the gate circuit generates negative voltage. By means of selecting the value of the resistance $R_3$ such that the time from occurrence of short-circuit to the gate circuit generating negative voltage is shorter than the time from occurrence of short-circuit to the MOSGTO element $S_1$ turning-on, the MOSGTO element $S_1$ can be protected against short-circuit. Further the ON-state voltage can be decreased by employing the MOSGTO element $S_1$ as an element for controlling the main current.

Figure 11:
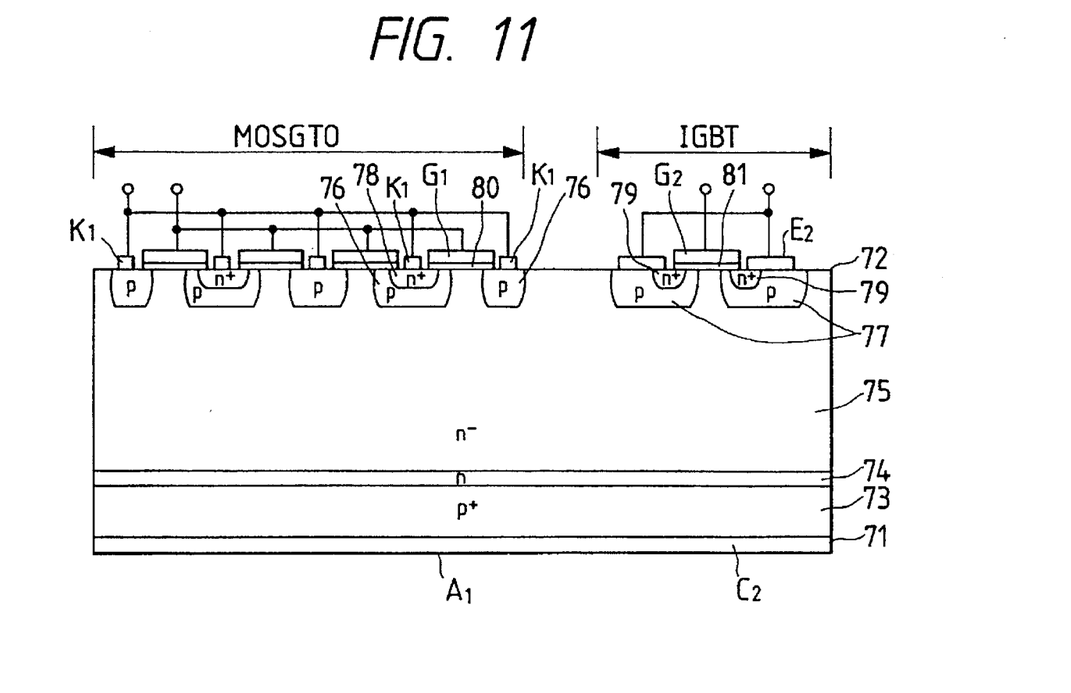
FIG. 11 is a schematic circuit diagram of the first voltage control semiconductor element and the second voltage control semiconductor element used in FIG. 10.

FIG. 11 shows an embodiment in which the first voltage control semiconductor element and the second voltage control element used in the semiconductor device in FIG. 10 are formed in a single semiconductor substrate. In this figure, the numeral 7 is a semiconductor substrate having a pair of main surfaces 71 and 72. The semiconductor substrate has a $p^+$-layer 73 adjacent to one of the main surface 71, an n-layer 74 adjacent to the $p^+$-layer 73, an $n^-$-layer 75 adjacent to the n-layer 74 and the other main surface 72, a plurality of p-regions 76 extending from the other main surface 72 into the $n^-$-layer 75, a plurality of p-regions 77 extending from the other main surface 72 in the position apart from the p-regions 76 into the $n^-$-layer 75, $n^+$-regions 78 extending from the other main surface 72 in every other position of the plural p-regions 76 into the p-regions 76, an $n^+$-region 79 extending from the other main surface 72 into the p-region 77. An anode electrode $A_1$ contacts to the $p^+$-layer 73, a cathode electrode $K_1$ contacting to the $n^+$-region 78 and the p-region 76 in which the $n^+$-region is not formed, a gate electrode $G_1$ being provided in the position from the $n^+$-region 78 to the $n^-$-layer 75 across the p-region 76 through a gate insulating film 80. And further, a collector electrode $C_2$ contact to the $p^+$-layer 73, an emitter electrode $E_2$ contacting to the p-region 77 and to the $n^+$-region 79, a gate electrode $G_2$ being provided in the portion from the $n^+$-region 79 to $n^-$-layer 75 across the p-region 77 through a gate insulating film 81. A MOSGTO element is constructed with the anode electrode $A_1$, the $p^+$-layer 73, the n-layer 74, the $n^-$-layer 75, the p-region 76, the $n^+$-region 78, the cathode electrode $K_1$ and gate electrode $G_1$. A sub-IGBT element $S_2$ is constructed with the collector electrode $C_2$, the $p^+$-layer 73, the n-layer 74, the $n^-$-layer 75, the p-region 77, the $n^+$-region 79, the emitter electrode $E_2$ and the gate electrode $G_2$.

The MOSGTO element $S_1$ operates as follows. By means of applying positive voltage to the gate electrode $G_1$ under the state where the cathode $K_1$ is grounded and positive voltage is applied to the anode $A_1$, the p-region 76 just below the gate oxide film 80 is reversed to form channel, and electrons begin to flow from the $n^+$-region 78 to the $n^-$-region 75. By the electrons, the p-n junction between the $p^+$-layer 73 and the n-layer 74 is normally biased and positive holes are injected into the $n^-$-layer 75. By the positive electrons, the p-n junction between the $n^+$-region 78 and the p-region 76 is normally biased and electrons are injected from the $n^+$-region 78 not through the channel. That is, the thyristor composed of the $n^+$-region 78, the p-region 76, the $n^-$-layer 75, the n-layer 74, the $p^+$-layer 73 turns on. The MOSGTO element $S_1$ is injected with carrier into the $n^-$-layer 75 from the p-n junction composed of the $n^+$-region 78 and the p-region 76 and the p-n junction composed of $p^+$-layer 73 and the n-layer 74. Since there are two portions injecting carrier, the injected amount of carrier is larger than IGBT, which has only one region to be injected with carrier into the collector side, and has large output current, and consequently the ON-sate voltage is low. Especially in a high voltage resistant element above 1000 V, the difference in ON-state voltages between the MOSGTO and the IGBT is large since the thickness of the $n^-$-layer becomes large. Negative voltage is applied to the gate electrode $G_1$ when turning off. By doing so, the $n^-$-layer 75 just below the gate oxide film 80 is reversed, the positive holes accumulated in the vicinity of the p-n junction composed of the p-region 76 and the $n^+$-region 78 being drawn into the power source through the p-region 76 not having the $n^+$-region 78, the MOSGTO element $S_1$ turning off due to stopping of electron injection from the $n^+$-region 78.

Since the MOSGTO element $S_1$ has injection regions in both the anode side and the cathode side, the MOSGTO element is injected more carrier and has larger saturated current than the IGBT. Therefore, in the past, when occurrence of a short-circuit, the MOSGTO element has been broken in a short time and consequently the device cannot have been protected from break. In the present invention, by means of choosing the resistance $R_3$ such that the control voltage is lowered before the semiconductor element conducting the main current turns on, current does not flow through the MOSGTO element $S_1$ conducting the main current even when an ON-signal is entered. Therefore, the element having a substantially large saturated current such as MOSGTO element $S_1$ can be protected. And further the ON-state voltage can be lowered by employing a MOSGTO element as the element to control the main current.

Figure 12:
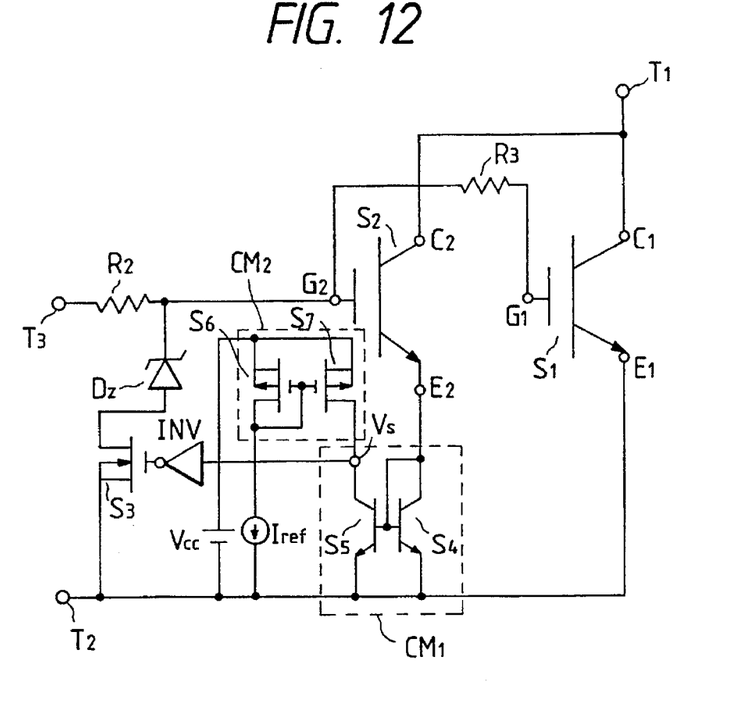
FIG. 12 is a schematic circuit diagram showing a still further embodiment of a semiconductor device in accordance with the present invention.

FIG. 12 is a schematic circuit diagram showing a further different embodiment of a semiconductor device in accordance with the present invention. The different point from the embodiments above-mentioned is that a current mirror is used instead of the resistance $R_1$. The symbol $CM_1$ is a first current mirror circuit composed of two bipolar transistors $S_4$ and $S_5$ of which the base electrodes are connected to each other and both of the emitter electrodes are connected to a second main terminal $T_2$, the symbol $CM_2$ being a second current mirror circuit composed of two MOSFET elements $S_6$ and $S_7$ of which the gate electrodes are connected to each other and both of the emitter electrodes are connected to each other, the symbol $V_{cc}$ being a power source connected between both of the emitter electrodes of the second current mirror circuit $CM_2$ and the second main terminal $T_2$, the symbol $I_{ref}$ being a current source connected between the collector electrode of the MOSFET element $S_6$ in the second current mirror circuit $CM_2$ and the second main terminal $T_2$, the symbol INV being an inverter connected between the collector electrode of the bipolar transistor $S_5$ in the first current mirror circuit $CM_1$ and the gate electrode of the MOSFET element $S_3$. The collector electrode of the bipolar transistor $S_4$ in the first current mirror circuit $CM_1$ is connected to the emitter electrode $E_2$ of the sub-IGBT element $S_2$ and to the base electrode of the bipolar transistor $S_5$, the collector electrode of the MOSFET element $S_6$ being connected to the gate electrode of the MOSFET element $S_7$. The operation of the semiconductor device having such a construction will be described below. In this embodiment, short-circuit is detected by comparing the standard current flowing from the second current mirror circuit $CM_2$ to the current source $I_{ref}$ with the detected current flowing in the first current mirror circuit $CM_1$. That is, when the standard current is lager than the detected current, the input voltage $V_s$ of the inverter INV is in the voltage of the power source $V_{cc}$. When the standard current is smaller than the detected current, the input voltage $V_s$ of the inverter INV is in the voltage of the main terminal $T_2$. Since the inverter INV inverses the input voltage $V_s$, the gate voltage of the MOSFET element $S_3$ becomes the voltage of the second main terminal $T_2$ and consequently the MOSFET element $S_3$ does not turn on when the input voltage $V_s$ is the voltage of the power source $V_{cc}$. When the input voltage $V_s$ is the voltage of the second main terminal $T_2$, the gate voltage of the MOSFET element $S_3$ becomes a voltage in high level and the MOSFET element $S_3$ turns on. In other words, when the standard current becomes smaller than the detected current (when a short-circuit occurs), the MOSFET element $S_3$ turns on. In a case where a resistance $R_1$ is used as means for detecting short-circuit, there is a disadvantage in that the voltage drop of the resistance $R_1$ serving as a standard for detecting short-circuit varies depending on the temperature since the magnitude of the resistance varies with temperature. On the other hand, in a case where a current mirror circuit is used as means for detecting short-circuit, the effect of temperature change does not appears in the output characteristic since the characteristic of each element composing the current mirror circuit varies in the same against temperature.

The embodiments having been described above are for protecting the device from short-circuit at starting of operation, and cannot protect the device when, for example, an over-current flows due to an over-load.

Figure 13:
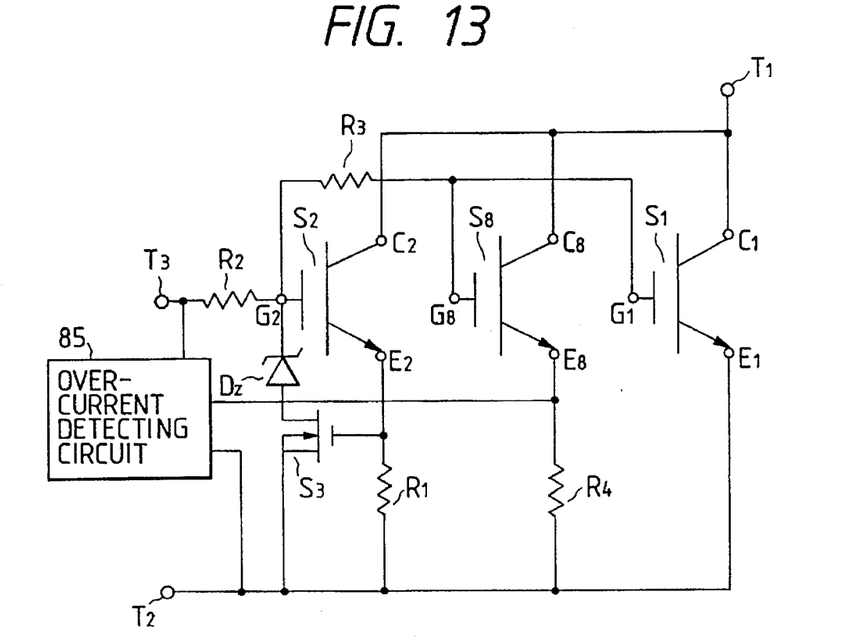
FIG. 13 is a schematic circuit diagram showing another embodiment of a semiconductor device in accordance with the present invention.

FIG. 13 shows a different embodiment of a semiconductor device according to the present invention capable of protecting the device from an over-current. The different point from the semiconductor device shown in FIG. 1 is that a circuit connecting a third IGBT element $S_8$ conducting smaller current than the main IGBT element $S_1$ and a resistance $R_4$ in series is connected to the main IGBT element $S_1$ in parallel, the gate electrode $G_8$ of the third IGBT element $S_8$ being connected to the gate electrode $G_1$ of the main IGBT element $S_1$, an over-current detecting circuit 85 being connected between the second main terminal $T_2$ and the control terminal $T_3$, the over-current detecting circuit 85 receives a signal from the junction point of the third IGBT element $S_8$ and the resistance $R_4$. When an over-current flows through the main IGBT element $S_1$, a current lager than its normal current also flows through the third IGBT element $S_8$, and consequently the voltage drop of the resistance $R_4$ increases. When the voltage drop exceeds a certain value, the over-current detecting circuit 85 operates to lower the voltage of the control terminal $T_3$ and to prevent the over-current from flowing by decreasing the current.

Although description has been made on cases where n-type semiconductor elements are used, it is obvious that the present invention can be applied to cases where p-type semiconductor elements are used by reversing n-type to p-type.

Figure 14:
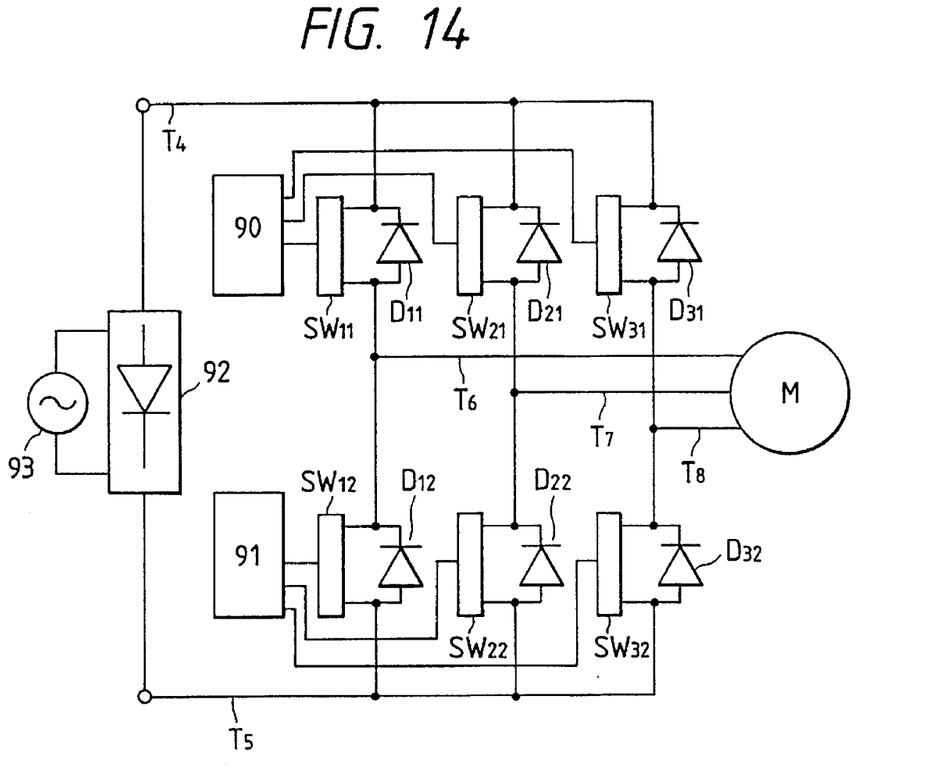
FIG. 14 is a schematic circuit diagram showing an inverter system using a semiconductor device in accordance with the present invention.

FIG. 14 is an electric circuit diagram showing an embodiment of an inverter system for driving a motor constructed by using the semiconductor device described above. In this figure, the symbols $T_4$ and $T_5$ are a pair of terminals connected to a direct current power source, the symbols $T_6$, $T_7$ and $T_8$ are the same number of alternating current terminals as the number of phase in alternating current side connected to a three phase induction motor M, the symbols $SW_{11}$, $SW_{12}$, $SW_{21}$, $SW_{22}$, $SW_{31}$ and $SW_{32}$ are semiconductor devices according to the present invention connected in series by two devices and in parallel for three phase between a pair of the direct current terminals $T_4$ and $T_5$. The junction points of connecting two of the semiconductor devices are connected to the alternating current terminals $T_6$, $T_7$ and $T_8$ respectively. The symbols $D_{11}$, $D_{12}$, $D_{21}$, $D_{22}$, $D_{31}$ and $D_{32}$ are flywheel diodes connected to the semiconductor devices each in inverse parallel. The numeral 90 is an upper arm drive circuit for giving a gate signal to the semiconductor devices $SW_{11}$, $SW_{21}$ and $SW_{31}$ in the upper side of the inverter system, the numeral 91 being a down arm drive circuit for giving a gate signal to the semiconductor devices $SW_{12}$, $SW_{22}$ and $SW_{32}$ in the down side of the inverter system, the numeral 92 being a converter supplying direct current electric power to a pair of direct current terminals $T_4$ and $T_5$, the numeral 93 being an alternating current power source supplying alternating current electric power to the converter. By constructing an inverter system by using the semiconductor devices according to the present invention, it can be realized to attain a substantially large energy saving comparing to a conventional system composed of IGBT's. Further, in a conventional system, a large saturated current flows when a short-circuit occurs, and a large over-shoot voltage is generated if the current is directly cut off at a high speed. Therefore, it is required at a short-circuit accident to cut off the current slowly using a gate circuit other than one used in a normal condition. Explaining more specifically using numerical example, the current flowing through an IGBT decreases to zero in approximately 200 nsec. Therefore, if the current is cut off at a moment, the value di/dt becomes $2\times10^9$ A/sec. From the value di/dt and the inductance L of wiring, the voltage L×di/dt is generated. Assuming the inductance L 0.1 µH, the generated voltage becomes 200 V. In order to suppress the generated voltage, it is required to cut off the current slowly. In the semiconductor device according to the present invention, the over-shoot voltage becomes approximately 100 V even if the current is cut off at the normal speed since the saturated current is suppressed approximately 200 A which is a half of that in a conventional system. Consequently, a gate circuit for short-circuit accident is not required, and the gate circuit can be simplified.

It is also expected that the same effect can be attained if the conducting type of the semiconductor device described above is reversed.

According to the semiconductor device in accordance with the present invention, since the first voltage control semiconductor element for controlling the main current turns ON-state with a delay behind the second voltage control semiconductor element for detecting the over-current and the saturated current per unit area of the first voltage control element is larger than that of the second voltage control semiconductor element, in normal condition the ON-state voltage is small and at occurrence of a short-circuit accident the short-circuit accident is detected with the second voltage control semiconductor element before the first voltage control semiconductor element turns on to prevent the first voltage control semiconductor element from conducting over-current. Therefore, the short-circuit resistivity of the semiconductor device can be substantially improved.

What is claimed is:

1. A semiconductor device comprising:

a first main terminal;

a second main terminal having a voltage different from the voltage of the first main terminal;

a control terminal;

a first voltage control semiconductor element for conducting the flow of a main current therethrough, one of the main electrodes of the first control semiconductor element being connected to the first main terminal, the other main electrode being connected to the second main terminal;

a second voltage control semiconductor element having both of a current capacity and a saturated current per unit area smaller than those of the first voltage control semiconductor element, one of the main electrodes of the second control semiconductor element being connected to the first main terminal, the other main electrode being connected to the second main terminal through a resistance, the control electrode being connected to the control terminal, wherein the second voltage control semiconductor element permits the flow of a fraction of the main current therethrough and operates to detect a possible overcurrent flowing through the first voltage control semiconductor element;

means for decreasing a control voltage applied to the control electrodes of the first and the second voltage control semiconductor elements when the voltage developed across the resistance caused by the current flowing through the second voltage control semiconductor element exceeds a given value; and a delay element connected between the control electrode of the first voltage control semiconductor element and the control electrode of the second voltage control semiconductor element, wherein the delay element delays the turning-on of the first voltage control semiconductor element to be after the turning-on of the second voltage control semiconductor element when an ON-signal is applied to the control terminal.

2. A semiconductor device comprising:

a first main terminal;

a second main terminal having a voltage different from the voltage of the first main terminal;

a control terminal;

a first voltage control semiconductor element for conducting the flow of a main current therethrough, one of the main electrodes of the first control semiconductor element being connected to the first main terminal, the other main electrode being connected to the second main terminal;

a second voltage control semiconductor element having both of a current capacity and a saturated current per unit area smaller than those of the first voltage control semiconductor element, one of the main electrodes of the second control semiconductor element being connected to the first main terminal, the other main electrode being connected to the second main terminal through a resistance, the control electrode being connected to the control terminal, wherein the second voltage control semiconductor element permits the flow of a fraction of the main current therethrough and operates to detect a possible overcurrent flowing through the first voltage control semiconductor element;

a switching element, a pair of the main electrodes of the switching element being connected to the control terminal and the second main terminal, the control electrode being connected to the junction point of the other main electrode of the second voltage control semiconductor element and the resistance, wherein the switching element is turned on when the voltage developed across the resistance caused by the current flowing through the second voltage control semiconductor element exceeds a given value and decreases a control voltage applied to the control electrodes of the first and the second voltage control semiconductor elements; and a delay element connected between the control electrode of the first voltage control semiconductor element and the control electrode of the second voltage control semiconductor element, wherein the delay element delays the turning-on of the first voltage control semiconductor element to be after the turning-on of the second voltage control semiconductor element when an ON-signal is applied to the control terminal.

3. A semiconductor device according to claim 2, wherein the semiconductor device satisfies the inequality $t_1+t_2>t_3$, where $t_2$ is the time interval from applying an ON-signal to the control terminal to turning-on of the first voltage control semiconductor element, $t_1$ being the short-circuit resistivity of the first voltage control semiconductor element without the delay element, and $t_3$ being the time interval from applying an ON-signal to the control terminal to turning-on of the switching element.

4. A semiconductor device according to claim 3, wherein the semiconductor device satisfies the inequality $t_1>t_3$.

5. A semiconductor device according to any one of claim 2, claim 3 or claim 4, wherein a Zener diode is connected between the control electrode of the second voltage control semiconductor element and one of the main electrodes of the switching element.

6. A semiconductor device according to any one of claim 2, claim 3, claim 4 or claim 5, wherein the first voltage control semiconductor element and the second voltage control semiconductor element are insulated gate bipolar transistors.

7. A semiconductor device according to claim 6, wherein the channel length of the first voltage control semiconductor element is shorter than that of the second voltage control semiconductor element.

8. A semiconductor device according to any one of claim 6 or claim 7, wherein the thickness of gate oxide film of the first voltage control semiconductor element is thinner than that of the second voltage control semiconductor element.

9. A semiconductor device according to any one of claim 6, claim 7 or claim 8, wherein the threshold voltage of the first voltage control semiconductor element is lower than that of the second voltage control semiconductor element.

10. A semiconductor device according to any one of claim 2, claim 3, claim 4, claim 5, claim 6, claim 7, claim 8 or claim 9, wherein the delay element includes a resistance.

11. A semiconductor device according to any one of claim 2, claim 3, claim 4, claim 5, claim 6, claim 7, claim 8, claim 9 or claim 10, wherein the first voltage control semiconductor element, the second voltage control semiconductor element and the switching element are formed on a single semiconductor substrate.

12. A semiconductor device comprising:

a first main terminal;

a second main terminal having a voltage different from the voltage of the first main terminal;

a control terminal;

an insulated gate bipolar transistor for conducting the flow of a main current therethrough, of which the collector electrode is connected to the first main terminal, the emitter electrode being connected to the second main terminal;

a MOS transistor having both of a current capacity and a saturated current per unit area smaller than the insulated gate bipolar transistor, the drain electrode of the MOS transistor being connected to the first main terminal, the source electrode being connected to the second main terminal through a resistance, wherein the MOS transistor permits the flow of a fraction of the main current therethrough and operates to detect a possible overcurrent flowing through the insulated gate bipolar transistor;

a switching element, a pair of the main electrodes of the switching element being connected to the control terminal and the second main terminal, the control electrode being connected to the junction point of the source electrode of the MOS transistor and the resistance, wherein the switching element is turned on when the voltage developed across the resistance caused by the current flowing through the MOS transistor exceeds a given value and decreases a control voltage applied to the gate electrodes of the insulated gate bipolar transistor and the MOS transistor; and a delay element connected between the gate electrode of the insulated gate bipolar transistor and the gate electrode of the MOS transistor, wherein the delay element delays the turning-on of the insulated gate bipolar transistor to be after the turning-on of the MOS transistor when an ON-signal is applied to the control terminal.

13. A semiconductor device according to claim 12, wherein the semiconductor device satisfies the inequality $t_1+t_2>t_3$, where $t_2$ is the time interval from applying an ON-signal to the control terminal to turning-on of the insulated gate bipolar transistor, $t_1$ being the short-circuit resistivity of the insulated gate bipolar transistor without the delay element, and $t_3$ being the time interval from applying an ON-signal to the control terminal to turning-on of the switching element.

14. A semiconductor device according to claim 13, wherein the semiconductor device satisfies the inequality $t_1>t_3$.

15. A semiconductor device according to any one of claim 12, claim 13 or claim 14, wherein a Zener diode is connected between the gate electrode of the MOS transistor and one of the main electrodes of the switching element.

16. A semiconductor device according to any one of claim 12, claim 13, claim 14 or claim 15, wherein the delay element includes a resistance.

17. A semiconductor device according to any one of claim 12, claim 13, claim 14, claim 15 or claim 16, wherein the insulated gate bipolar transistor, the MOS transistor and the switching element are formed on a single semiconductor substrate.

18. A semiconductor device comprising:

a first main terminal;

a second main terminal having a voltage different from the voltage of the first main terminal;

a control terminal;

A MOS gate turn-off thyristor for conducting the flow of a main current therethrough, of which the anode electrode is connected to the first main terminal, the cathode electrode being connected to the second main terminal, wherein the insulated gate bipolar transistor permits the flow of a fraction of the main current therethrough and operates to detect a possible overcurrent flowing through the MOS gate turn-off thyristor;

an insulated gate bipolar transistor having both of an current capacity and a saturated current per unit area smaller than those of the MOS gate turn-off thyristor, the collector electrode of the insulated gate bipolar transistor being connected to the first main terminal, the emitter electrode being connected to the second main terminal through a resistance;

a gate circuit being connected between the second main terminal and the control terminal, putting out a positive control signal when the voltage at the junction point of the emitter electrode of the insulated gate bipolar transistor and the resistance is lower than a given value, putting out a negative control signal when the voltage at the junction point of the emitter electrode of the insulated gate bipolar transistor and the resistance is higher than the given value;

a delay element connected between the gate electrode of the MOS gate turn-off thyristor and the gate electrode of the insulated gate bipolar transistor, wherein the delay element delays the turning-on of the MOS gate turn-off thyristor to be after the turning-on of the insulated gate bipolar transistor when an ON-signal is applied to the control terminal.

19. A semiconductor device according to claim 18, wherein the delay element includes a resistance.

20. A semiconductor device according to any one of claim 18 or claim 19, wherein the MOS gate turn-off thyristor and the insulated gate bipolar transistor are formed on a single semiconductor substrate.

21. A semiconductor device comprising:

a first main terminal;

a second main terminal having a voltage different from the voltage of the first main terminal;

a control terminal;

a first insulated gate bipolar transistor, of which the collector electrode is connected to the first main terminal, the emitter electrode being connected to the second main terminal;

a second insulated gate bipolar transistor having both of a current capacity and a saturated current per unit area smaller than the first insulated gate bipolar transistor, the collector electrode of the second insulated gate bipolar transistor being connected to the first main terminal, the emitter electrode being connected to the second main terminal through a first resistance;

a switching element, a pair of the main electrodes of the switching element being connected to the control terminal and the second main terminal, the control electrode being connected to the junction point of the emitter electrode of the second insulated gate bipolar transistor and the first resistance;

a delay element connected between the gate electrode of the first insulated gate bipolar transistor and the gate electrode of the second insulated gate bipolar transistor;

a third insulated gate bipolar transistor having both of a current capacity and a saturated current per unit area smaller than the first insulated gate bipolar transistor, the collector electrode of the third insulated gate bipolar transistor being connected to the first main terminal, the emitter electrode being connected to the second main terminal through a second resistance, the gate electrode being connected to the gate electrode of the first insulated gate bipolar transistor; and means being connected between the second main terminal and the control terminal, putting out an OFF-control signal to the control terminal when the voltage at the junction point of the emitter electrode of the third insulated gate bipolar transistor and the second resistance is higher than a given value.

22. A semiconductor device according to claim 21, wherein the semiconductor device satisfies the inequality $t_1+t_2>t_3$, where $t_2$ is the time interval from applying an ON-signal to the control terminal to turning-on of the first insulated gate bipolar transistor, $t_1$ being the short-circuit resistivity of the first insulated gate bipolar transistor without the delay element, and $t_3$ being the time interval from applying an ON-signal to the control terminal to turning-on of the switching element.

23. A semiconductor device according to claim 22, wherein the semiconductor device satisfies the inequality $t_1 > t_3$.

24. A semiconductor device according to any one of claim 21, claim 22 or claim 23, wherein a Zener diode is connected between the gate electrode of the second gate bipolar transistor and one of the main electrode of the switching element.

25. A semiconductor device according to any one of claim 21, claim 22, claim 23 or claim 24, wherein the channel length of the first insulated gate bipolar transistor is shorter than that of the second insulated gate bipolar transistor.

26. A semiconductor device according to any one of claim 21, claim 22, claim 23, claim 24 or claim 25, wherein the thickness of the gate oxide film of the first insulated gate bipolar transistor is thinner than that of the second insulated gate bipolar transistor.

27. A semiconductor device according to any one of claim 21, claim 22, claim 23, claim 24, claim 25 or claim 26, wherein the threshold voltage of the first insulated gate bipolar transistor is smaller than that of the second insulated gate bipolar transistor.

28. A semiconductor device according to any one of claim 21, claim 22, claim 23, claim 24, claim 25, claim 26 or claim 27, wherein the delay element includes a resistance.

29. A semiconductor device according to any one of claim 21, claim 22, claim 23, claim 24, claim 25, claim 26, claim 27 or claim 28, wherein the first insulated gate bipolar transistor, the second insulated gate bipolar transistor, the third insulated gate bipolar transistor and the switching element are formed on a single semiconductor substrate.

* * * * *